United States Patent
Paepcke et al.

(10) Patent No.: US 10,205,428 B1
(45) Date of Patent: Feb. 12, 2019

(54) VARIABLE AUDIBLE-ALERT DEVICE

(71) Applicant: Toyota Research Institute, Inc., Los Altos, CA (US)

(72) Inventors: Stephanie Paepcke, Mountain View, CA (US); James Cazzoli, Mahopac, NY (US); Thor Lewis, Sunnyvale, CA (US); Ashlimarie Dong, San Francisco, CA (US)

(73) Assignee: Toyota Research Institute, Inc., Los Altos, CA (US)

( * ) Notice: Subject to any disclaimer, the term of this patent is extended or adjusted under 35 U.S.C. 154(b) by 0 days.

(21) Appl. No.: 15/799,285

(22) Filed: Oct. 31, 2017

(51) Int. Cl.
*G08G 1/16* (2006.01)
*H03G 3/32* (2006.01)
*B60Q 9/00* (2006.01)

(52) U.S. Cl.
CPC ............... *H03G 3/32* (2013.01); *B60Q 9/00* (2013.01)

(58) Field of Classification Search
None
See application file for complete search history.

(56) References Cited

U.S. PATENT DOCUMENTS

| | | |
|---|---|---|
| 2003/0006897 A1 | 1/2003 | Chapin et al. |
| 2004/0036580 A1 | 2/2004 | Michelson |
| 2012/0286970 A1 | 11/2012 | Castillo |
| 2016/0236690 A1* | 8/2016 | Juneja ................. G06F 3/16 |
| 2017/0108864 A1* | 4/2017 | Wiklinska ............ G06N 5/022 |
| 2017/0162046 A1* | 6/2017 | Alanazi ................ G08G 1/16 |
| 2017/0291543 A1* | 10/2017 | Goldman-Shenhar ... B60Q 9/00 |
| 2017/0303037 A1* | 10/2017 | Kobayashi ............. H04R 3/005 |

FOREIGN PATENT DOCUMENTS

KR 20040108209 12/2004

* cited by examiner

*Primary Examiner* — Brent Swarthout
(74) *Attorney, Agent, or Firm* — Christopher G. Darrow; Darrow Mustafa PC (57) ABSTRACT

A method and device for variable audible-alerts based on a vehicle environment are disclosed, in which vehicle sensor data relating to a vehicle environment may be received and processed to produce vehicle-environment recognition data. Audible alert data is selected from a plurality of audible alert data corresponding to the vehicle-environment recognition data, from which a command message is generated based on the audible alert data. The command message is transmitted to effect an audible alert via an audible device.

20 Claims, 6 Drawing Sheets

FIG. 1

FIG. 2
vehicle network environment 201

FIG. 4
variable audible-alert device 110

| audible alert icon 205 | audible alert data 418 | | | desired objective state 414 |
|---|---|---|---|---|
| | volume field 504 | pattern field 506 | frequency field 508 | |
| 😐 | low | gentle taps | f1 | start flow of traffic at traffic stop |
| 😧 | low | continuous | f1, f2 | animal deterrence |
| 😮 | medium | short-long | f3 | draw attention |
| 😲 | high | continuous | f3, f4 | dangerous situation |
| ooo | ooo | ooo | ooo | ooo |

520
530
540
550

FIG. 5
audible alert database 416 audible alert table 500

VARIABLE AUDIBLE-ALERT DEVICE

FIELD

The subject matter described herein relates in general to vehicle audible alert devices and, more particularly, to the control of vehicle audible-alert devices based on vehicle-environment recognition data.

BACKGROUND

Vehicles have generally been mounted with audible warning devices for generating a warning to another vehicle, a pedestrian, or the like. A volume level of the warning have generally been set to a singular, set level so as to satisfy industry specifications for causing the audible warning to be recognizable by others vehicles; however, one response may not suit all vehicle environments. For example, pedestrians and/or bicyclists may feel that the volume level is excessively high in some cases, causing them to be unnecessarily startled.

Some audible warning devices may include a loud volume level for other vehicles, and another, softer volume level for pedestrians and/or bicyclists (such as a whistle or other sound).

Also, because a hybrid vehicle may operate at a quiet level, as compared with a conventional combustion-engine vehicle, it may be necessary to make the vehicle's presence recognizable by another vehicle or pedestrians around the vehicle, but without the attention, or startling effect, that may be drawn by a convention, high-volume level audible warning. Also, conventional audible warning systems have either required excessive vehicle operator involvement, or distraction, to select and sound the appropriate audible warning.

SUMMARY

A variable audible-alert device and method having selectable output data based on vehicle sensor output data relating to a vehicle environment are disclosed.

In one implementation, a method for a variable audible-alert device is disclosed. The method includes receiving vehicle sensor data relating to a vehicle environment, and processing the vehicle sensor data to produce vehicle-environment recognition data. Audible alert data is selected from a plurality of audible alert data corresponding to the vehicle-environment recognition data, a command message is generated based on the audible alert data. The command message is transmitted to effect an audible alert via an audible device.

In another implementation, a variable audible-alert device is disclosed. The variable audible-alert device includes a communication interface, a processor, and memory. The communication interface operates to service communication with a vehicle network. The processor is coupled to the communication interface, and in communication with a plurality of vehicle sensor devices, the processor for controlling operations of the variable audible-alert device. The memory is coupled to the processor and to the plurality of vehicle sensor devices, in which the memory stores a vehicle sensor module, and an audible alert module. The memory stores the vehicle sensor module including instructions that when executed cause the processor to receive vehicle sensor data relating to a vehicle environment, and process the vehicle sensor data to produce vehicle-environment recognition data. The memory stores the audible alert module including instructions that when executed cause the processor to select audible alert data from a plurality of audible alert data corresponding to the vehicle-environment recognition data; and generate a command based on the audible alert data for transmission to effect an audible alert via an audible device.

BRIEF DESCRIPTION OF THE DRAWINGS

The description makes reference to the accompanying drawings wherein like reference numerals refer to like parts throughout the several views, and wherein.

DETAILED DESCRIPTION

A variable audible-alert device and method having selectable output data based on vehicle sensor output data relating to a vehicle environment are described. The variable audible-alert device may include instructions, which when executed by a processor, may vary one or more output characteristics of the audible device (such as alert intensity, frequency, pattern) to produce an audible alert. The output may be based on machine learning techniques (such as reinforcement learning (RL), convolutional neural networks (CNN), etc.), and may also be trained and/or self-taught based on user history with respect to audible alerts issued within various vehicle environments, or may be based on combinations thereof.

Figure 1:
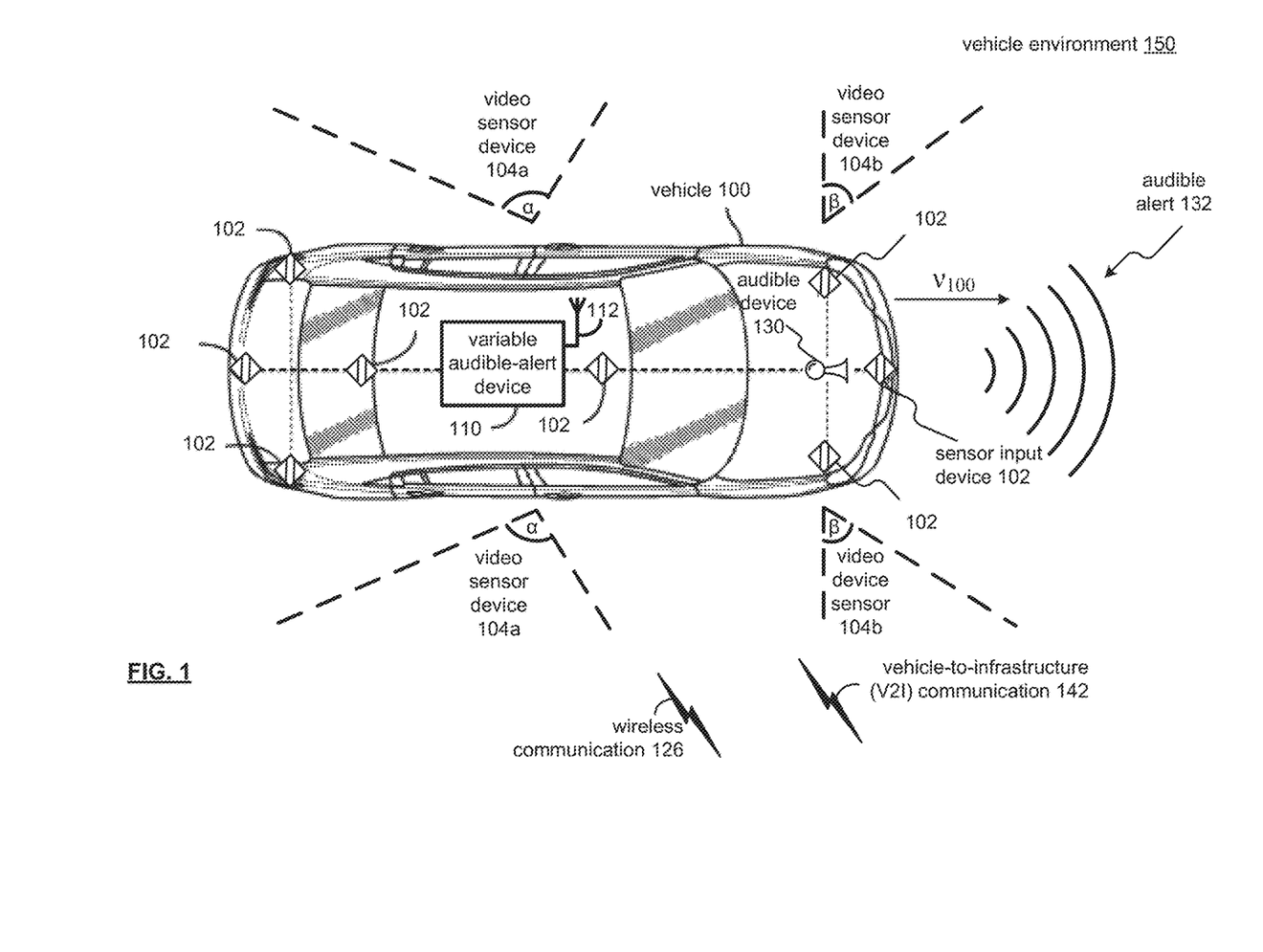
FIG. 1 is a schematic illustration of a vehicle including a variable audible-alert device.

FIG. 1 is a schematic illustration of a vehicle 100 including a variable audible-alert device 110. A plurality of sensor devices 102, 104, 106a and 106b are in communication with the variable audible-alert device 110 to access a vehicle environment 150, which may include an environment external to the vehicle 100 (such as pedestrians, objects, driving conditions, traffic conditions, etc.), and the environment within the cabin of the vehicle 100 (such as biometric sensor data relating to a vehicle driver's emotional state, eye-tracking, voice sensing, etc.). As may be appreciated, the vehicle 100 may also be an automobile, light truck, cargo transport, or any other passenger or non-passenger vehicle.

The variable audible-alert device 110 may operate to configure an audible alert 132 of an audible device 130 (such as a vehicle horn, speakers, etc.) based on a vehicle environment sensed with the vehicle sensors. In this respect, a vehicle operator may press and/or actuate a human-machine interface within the vehicle 100, such as via a center portion of a steering wheel, to emit an audible alert 132 suited for the particulars of the vehicle environment 150.

Various configurations of an audible device 130 may be implemented, such as a diaphragm audible device, a spiral exponential horn shape audible device, a speaker-based audible device, etc.

Audible device 130 may be used singly, or may be configured in a multiple configuration to produce multiple tones. Each of the multiple configuration of the audible device 130 may have an associated tone to a frequency interval, and each frequency interval may have multiple tones that may be sounded together or individually. As may be appreciated, in alerting to a hazardous condition, or perhaps expressing frustration, the use of two differing frequencies with their beat frequencies, and missing fundamental frequency, may be more perceptible than the use of multiple horns with similar frequency characteristics, particularly in an external environment 150 that may have a high ambient noise level. As may be appreciated, the audible device 130 may be responsive to a command message generated via the variable audible-alert device 110 such that an audible alert of a plurality of audible alerts may be effected via the audible device 130.

For instance, the vehicle 100 may be stopped at a traffic light behind another vehicle. When the light turns green, but the leading vehicle does not move, the operator of the vehicle 100 may wish to provide a couple of short, low volume, audible alert 132 to alert the vehicle ahead that the light has changed to green, as opposed to a full volume, blaring audible alert 132.

As another example, when the vehicle 100 may be aggressively cut off by another vehicle, a full blast honk or an angrier or harsh noise may be considered appropriate. As yet another example, when the vehicle is approaching pedestrian or other driver that they know, a friendly audible alert 132 may be appropriate as a manner of drawing the individual's attention and providing a warm greeting.

Generally, the variable audible-alert device 110 may, from sensor device data, operate to produce vehicle-environment recognition data based on machine learning techniques (such as reinforcement learning (RL), convolutional neural networks (CNN), etc.). Corresponding to vehicle-environment recognition data, the variable audible-alert device may select audible alert data, and generate a command message for transmission of the audible alert 132 via the audible device 130 upon a human-machine interface input by a vehicle operator.

As may also be appreciated, variable audible-alert device 110 may be configured by the vehicle operator to select the tones (patterns, volumes, frequencies) for the audible alert 132. Alternatively, the vehicle can be initially configured for a set of default tones for the audible alert 132. Through machine learning, the variable audible-alert device 110 may generate driver behaviors as may relate to audible alerts 132 corresponding to patterns within the vehicle environment 150. The vehicle environment 150 may include the presence of objects (e.g., pedestrians, animals, other vehicles, etc.), the trajectory of such objects, level of traffic congestion, data received via traffic signaling devices (vehicle-to-infrastructure (V2I) communications), current vehicle location, etc.

The variable audible-alert device 110 may also select an audible alert 132 corresponding to driver-related information, or internal vehicle-environment conditions (e.g., the driver's emotional state). When the driver may be angry, then a more intense output for the audible alert 132 may be appropriate, or in the alternative, to deter escalation of a potential road-rage incident, may configure the audible alert 132 to other than an "angry" tone. As another example, when a driver may be cheerful, such as recognizing a colleague or friend, the variable audible-alert device 110 may configure the audible alert 132 for a friendly, attention-getting tone.

As yet another example, the variable audible-alert device 110 may identify different objects in the external environment. For example, the variable audible-alert device 110 may detect certain animals, and through initial configuration, may select an audible alert 132 specific to the detected animal. For instance, some animals may hear certain frequencies that humans cannot. The output of the audible device 130 can be tailored to such frequencies. For example, the variable audible-alert device 110 may cause the audible device 130, upon engagement by the vehicle operator of the human-machine interface, to emit an audible alert 132 having a tone that may be undetectable by the human ear (such as a "dog whistle"). However, to also provide feedback to the vehicle operator, when engaging the human-machine interface, a human-audible tone may also be issued via the audible alert 132 (for example, straight tone, a simulated dog bark, a tiger roar, etc.).

With respect to sensing the vehicle environment 140, the plurality of sensor devices 102 and/or 104 may be positioned on the outer surface of the vehicle 100, or may be positioned in a concealed fashion for aesthetic purposes with regard to the vehicle. Moreover, the sensors may operate at frequencies in which the vehicle body or portions thereof appear transparent to the respective sensor device.

Communication between the sensors and vehicle control units, including variable audible-alert device 110, may be on a bus basis, and may also be used or operated by other systems of the vehicle 100. For example, the sensor devices 102 and/or 104 and/or 106 may be coupled by a combination of network architectures such as a Body Electronic Area Network (BEAN), a Controller Area Network (CAN) bus configuration, an Audio Visual Communication-Local Area Network (AVC-LAN) configuration, and/or other combinations of additional communication-system architectures to provide communications between devices and systems of the vehicle 100.

The sensor devices may include sensor input devices 102, and video sensor devices 104a and 104b. The outputs of the example sensor devices 102 and/or 104 may be used by the variable audible-alert device 110 to detect vehicular transition events, which may then predict a vehicle-user input response. The predicted vehicle-user input response may then be used by the variable audible-alert device 110 to emphasize a subset of presented human-machine interface elements for facilitating the audible alert 132.

The sensor input devices 102, by way of example, may provide tactile or relational changes in the ambient conditions of the vehicle, such as an approaching pedestrian, cyclist, object, vehicle, road debris, and other such vehicle obstacles (or potential vehicle obstacles).

The sensor input devices 102 may be provided by a Light Detection and Ranging (LIDAR) system, in which the sensor input devices 102 may capture data related to laser light returns from physical objects in the environment of the vehicle 100. The sensory input devices 102 may also include a combination of lasers (LIDAR) and milliwave radar devices.

One or more of the video sensor devices 104a and 104b may be configured to capture changes in velocity, acceleration, and/or distance to these objects in the vehicle environment 140 of the vehicle 100, as well as the angle of approach. The video sensor devices 104a and 104b include sensing associated fields of view.

For the example of FIG. 1, the video sensor device 104a may include a three-dimensional field-of-view of angle-α, and the video sensor device 1064 may include a three-dimensional field-of-view of angle-β, with each video sensor having a sensor range for video detection.

In the various driving modes, the examples of the placement of the video sensor devices 104a for blind-spot visual sensing (such as for another vehicle adjacent the vehicle 100) relative to the vehicle user, and the video sensor devices 104b are positioned for forward periphery visual sensing (such as for objects outside the forward view of a vehicle user, such as a pedestrian, cyclist, vehicle, road debris, etc.).

For controlling data input from the sensors 102 and/or 104, the respective sensitivity and focus of each of the sensor devices may be adjusted to limit data acquisition based upon speed, terrain, activity density around the vehicle, etc.

The sensor devices 102 and 104 (that is, 104a and/or 104b) may, alone or in combination, operate to capture depth images or otherwise generating depth information for a captured image. For example, the sensor devices 102 and 104 may configured to capture images (visual and non-visual spectrum wavelengths, audible and non-audible wavelengths, etc.).

In this aspect, the sensor devices 102 and 104 are operable to determine distance vector measurements of objects in the environment of vehicle 100. For example, the sensor devices 102 and 104 may be configured to sense and/or analyze structured light, time of flight (e.g., of signals for Doppler sensing), light detection and ranging (LIDAR), light fields, and other information to determine depth/distance and direction of objects.

Alternatively, in some embodiments, the variable audible-alert device 110 may be operable to designate sensor devices 102 and 104 with different imaging data functions. For example, the variable audible-alert device 110 may designate one set of sensor devices for color imagery capture, designate another set of sensor devices to capture object distance vector data, designate (or re-purpose) yet another set of sensor devices to determine specific object characteristics, such as pedestrian attention data, pedestrian conduct data, an animal, traffic conditions, etc.

As shown in FIG. 1, the variable audible-alert device 110 may be configured to provide wireless communication 126, 142, 144, for communication with other vehicles (vehicle-to-vehicle (V2V) communication), with infrastructures (vehicle-to-infrastructure (V2I) infrastructure), with a network cloud, cellular data services, etc.

Accordingly, the variable audible-alert device 110 may operate to receive vehicle sensor data relating to the vehicle environment 150, process the vehicle sensor data to produce vehicle-environment recognition data, and select audible alert data from a plurality of audible alert data corresponding to the vehicle-environment recognition data to generate an appropriate command for configuring the audible device 130 to produce an audible alert 132, which is discussed in detail with reference to FIGS. 2-6.

Figure 2:
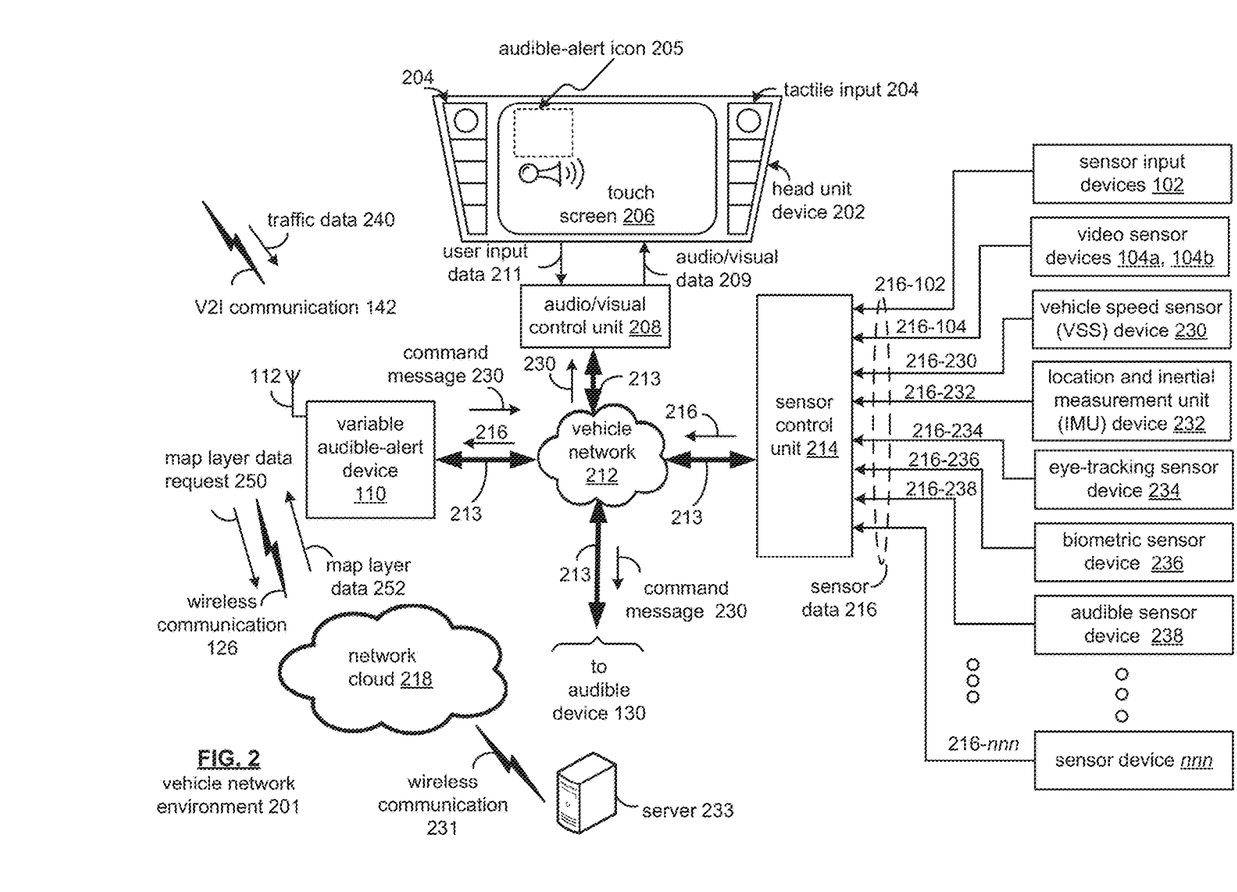
FIG. 2 illustrates a block diagram of the variable audible-alert device of FIG. 1 in the context of a vehicle network environment.

FIG. 2 illustrates a block diagram of a variable audible-alert device 110 in the context of a vehicle network environment 201. While the variable audible-alert device 110 is depicted in abstract with other vehicular components, the vehicle control unit 110 may be combined with the system components of the vehicle 100 (see FIG. 1).

The variable audible-alert device 110 may provide vehicle-to-human communication via a head unit device 202. The head unit device 202 may operate to provide communications to passengers and/or operators of the vehicle 100 via the touch screen 206.

As shown in FIG. 2, the variable audible-alert device 110 may communicate with the head unit device 202 via a communication path 213, and may also be wirelessly coupled with a network cloud 218 via the antenna 112 via wireless communication 126. From network cloud 218, a wireless communication 231 may provide communication access to a server 233.

In operation, the variable audible-alert device 110 may operate to receive vehicle sensor data 216 relating to a vehicle environment (FIG. 1).

The variable audible-alert device 110 may be operable to retrieve location data for the vehicle 100, via a global positioning satellite (GPS) data, and generate a request 250, based on the location data, for map layer data 252 via the server 233. The variable audible-alert device 110 may determine from the map layer data 252 the near real-time (NRT) traffic conditions, such as a general present traffic speed for roadway relative to a free-flowing traffic speed, traffic signal locations, traffic yield conditions, etc.

Traffic conditions may be understood as an implementation of right-of-way rules for traffic participant safety (autonomous vehicles as well as human drivers, pedestrians, bicyclists, etc.). A traffic yield condition may generally be present upon coming to a stop at a controlled and/or uncontrolled intersections, and may be indicated via map layer data 252, as well as vehicle-to-infrastructure communication 242 via traffic yield condition data 240. Traffic yield conditions are discussed in detail with reference to FIGS. 3-6.

Through the sensor control unit 214, the variable audible-alert device 110 may receive vehicle sensor data 216 relating to a vehicle environment. The vehicle environment may include the environment outside the vehicle, as well as the environment inside the vehicle. The variable audible-alert device 110 may operate to process the vehicles sensor data to produce vehicle-environment recognition data, and select audible alert data from a plurality of audible alert data corresponding to the vehicle-environment recognition data.

Sensor data 216 relating to the external vehicle environment may include sensor input data 216-102 of the sensor input device 102, video sensor data 216-104 of the video sensor devices 104a, 104b, vehicle speed data 216-230 of the vehicle speed sensor (VSS) device 230, location and inertial measurement unit (IMU) data 216-232 of the IMU device 232, etc. In this respect, the external vehicle environment may be recognized based on sensed headings (direction of travel, time of day, etc.), speeds (urban traffic speed, highway speeds, etc.), object detection/recognition (such as bicyclists, pedestrians, other vehicles, animals, etc.), and/or a combination thereof.

Further, the location and IMU device 232 may operate to measure and report the force, angular rate, etc., of the vehicle 100 through combinations of accelerometers, gyroscopes, sometimes magnetometers for determining changes in movement of the vehicle 100. A location aspect may operate to geographically track the vehicle 100, such as via a global positioning system (GPS) based technologies, as well as to operate relative to map layer data 252 data that may be retrieved via a third party server 233. The device 232 may be configured as an IMU-enabled GPS device, in which the IMU device component may provide operability to a location device, such as a GPS receiver, to work when GPS-signals are unavailable, such as in tunnels, inside parking garages, electronic interference, etc. The variable audible-alert device 110 may utilize data 216-232 as relating to a location and manner of approach to objects and/or traffic conditions and may be used to alone or in combination to produce vehicle-environment recognition data for selecting audible alert data.

Sensor data 216 relating to the internal vehicle environment may include eye-tracking sensor data 216-234 of the eye-tracking sensor device 234, biometric sensor data 216-

236 of the biometric sensor device 236, audible sensor data 216-238 of the audible sensor device 238, etc. In this respect, the internal vehicle environment may be recognized based on direction of the vehicle operator's gaze (such as to the side of the vehicle that may indicate a potential hazard, ahead of the vehicle indicating a likely hazard ahead, etc.), sensing skin temperature, coloration etc. (indicating the emotional state of the vehicle user, such as calm, frustrated, angry, etc.), the vehicle user's tone of voice (calm, angry, frustrated, etc.), and/or a combination thereof.

Internal and external vehicle environmental sensors may be further coupled and/or considered in combination to produce vehicle-environment recognition data for selecting audible alert data for configuring the variable audible-alert device 130. Also, additional sensor data 216-nnn may be provided by sensor device nnn for additional internal and/or external vehicle environment sensing as further technologies and configurations may be available.

The variable audible-alert device 110 may operate to produce vehicle-environment recognition data via machine learning technologies, such as reinforcement learning (RL), convolutional neural networks (CNN), and/or other artificial intelligence techniques. Such machine-learning technologies may function to learn vehicle operator preferences and/or objectives with various audible alert tones and/or patterns.

By processing the vehicle sensor data 216, the variable audible-alert device 110 may operate to produce command message 130 for transmission to the variable audible-alert device 130.

The command message 130 may effect an audible alert via the audible-alert device when the vehicle user presses a human-machine interface for the device 130 (such as a vehicle horn button collocated with the vehicle steering wheel). The command message 130 may be conveyed via the vehicle network 212 through the communication path (es) 213 to audio/visual control unit 208, and to vehicle-to-passenger communication via the head unit device 202

Still referring to FIG. 2, head unit device 202 may include, for example, tactile input 204 and a touch screen 206. The touch screen 206 may operates to provide visual output or graphic human-machine interfaces such as, for example, maps, navigation, entertainment, information, infotainment, and/or combinations thereof, which may be based on the map layer data 252, vehicle speed sensor (VSS) data 216-230, and location and inertial measurement unit (IMU) device 232, as well indicating the audible-alert configuration, or setting, for the audible device 130 via the command message 230.

For example, when the variable audible-alert device 110 generates a command message 130, the audio/visual control unit 208 may generate audio/visual data 209 that displays an audible-alert icon 205 based on the content of the command message 130, such as a "pleasant" icon, an "animal" icon, a "surprised" icon, a "frustrated" icon, and/or other forms of visual content, as well as audible content messaging that may provide an audible sample of a configuration for the alert device 130.

The touch screen 206 may include mediums capable of transmitting an optical and/or visual output such as, for example, a cathode ray tube, light emitting diodes, a liquid crystal display, a plasma display, etc. Moreover, the touch screen 206 may, in addition to providing visual information, detect the presence and location of a tactile input upon a surface of or adjacent to the display.

As may be appreciated, the communication path 213 of the vehicle network 212 may be formed a medium suitable for transmitting a signal such as, for example, conductive wires, conductive traces, optical waveguides, or the like. Moreover, the communication path 213 can be formed from a combination of mediums capable of transmitting signals. In one embodiment, the communication path 213 may include a combination of conductive traces, conductive wires, connectors, and buses that cooperate to permit the transmission of electrical data signals to components such as processors, memories, sensors, input devices, output devices, and communication devices.

Accordingly, the communication path 213 may be provided by a vehicle bus, or combinations thereof, such as for example, a Body Electronic Area Network (BEAN), a Controller Area Network (CAN) bus configuration, an Audio Visual Communication-Local Area Network (AVC-LAN) configuration, a Local Interconnect Network (LIN) configuration, a Vehicle Area Network (VAN) bus, a vehicle Ethernet LAN, a vehicle wireless LAN and/or other combinations of additional communication-system architectures to provide communications between devices and systems of the vehicle 100.

The term "signal" relates to a waveform (e.g., electrical, optical, magnetic, mechanical or electromagnetic), such as DC, AC, sinusoidal-wave, triangular-wave, square-wave, vibration, and the like, capable of traveling through at least some of the mediums described herein.

The vehicle network 212 may be communicatively coupled to receive signals from global positioning system satellites, such as via the antenna 112 of the variable audible-alert device 110, or other such vehicle antenna (not shown). The antenna 112 may include one or more conductive elements that interact with electromagnetic signals transmitted by global positioning system satellites. The received signals may be transformed into a data signal indicative of the location (for example, latitude and longitude positions), and further indicative of the positioning of the vehicle with respect to road data, in which a vehicle position can be indicated on a map displayed via the touch screen 206.

As may be appreciated, the wireless communication 126 and 142 may be based on one or many wireless communication system specifications. For example, wireless communication systems may operate in accordance with one or more standards specifications including, but not limited to, 3GPP (3rd Generation Partnership Project), 4GPP (4th Generation Partnership Project), 5GPP (5th Generation Partnership Project), LTE (long term evolution), LTE Advanced, RFID, IEEE 802.11, Bluetooth, AMPS (advanced mobile phone services), digital AMPS, GSM (global system for mobile communications), CDMA (code division multiple access), LMDS (local multi-point distribution systems), MMDS (multi-channel-multi-point distribution systems), IrDA, Wireless USB, Z-Wave, ZigBee, and/or variations thereof.

Also, in reference to FIG. 2, a server 233 may be communicatively coupled to the network cloud 218 via wireless communication 231. The server 233 may include third party servers that are associated with applications that running and/or executed on the head unit device 202, etc. For example, map data layer data 252 may be executing on the head unit device 202 and further include GPS location data to identify the location of the vehicle 100 in a graphic map display.

The server 233 may be operated by an organization that provides the application, such as a mapping application and map application layer data including roadway information data, traffic layer data, geolocation layer data, etc. Map layer data 252 may be provided in a Route Network Description File (RNDF) format.

A Route Network Description File specifies, for example, accessible road segments and provides information such as waypoints, stop sign locations, lane widths, checkpoint locations, parking spot locations, traffic yield conditions, etc. Servers such as server 233 may also provide data as Mission Description Files (MDF) for autonomous vehicle operation by vehicle 100 by, for example, variable audible-alert device 110 and/or a combination of vehicle control units such as audio/visual control unit 208, the sensor control unit 214, etc.

Figure 3:
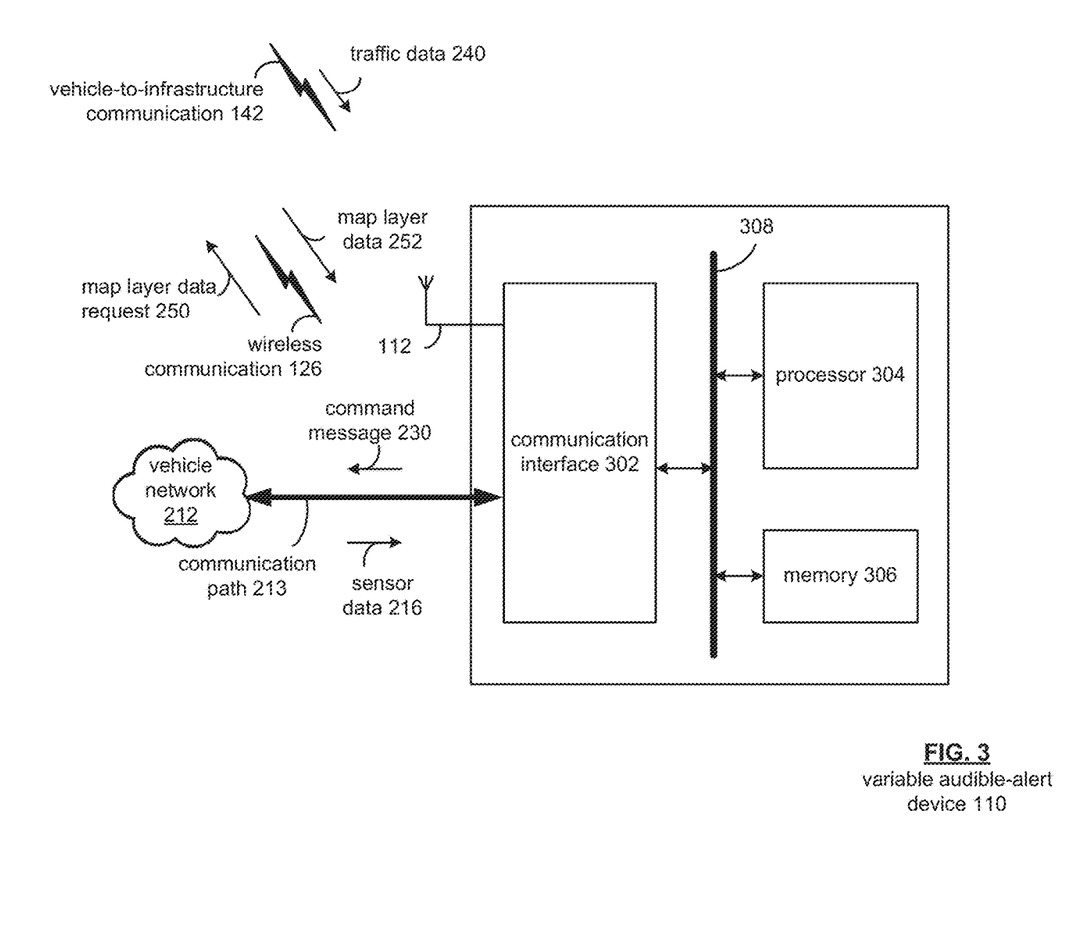
FIG. 3 is a block diagram of the variable audible-alert device of FIGS. 1 and 2.

FIG. 3 is a block diagram of a variable audible-alert device 110, which includes a communication interface 302, a processor 304, and memory 306, that are communicatively coupled via a bus 308. The communication interface 302 may function to service communications with a vehicle network 212. The processor 304 may be coupled to the communication interface 302 and in communication with a plurality of vehicle sensor devices to receive sensor data 216. The processor 304 may operate to control operations of the variable audible-alert device 110. Memory 306 is communicably coupled to the processor 304 and to the plurality of vehicle sensor devices to receive the vehicle sensor data 216, and store modules that include instructions that when executed cause the processor 304 to functions to provide the functionality of the disclosure, as is discussed in detail with reference to FIGS. 4-6.

The variable audible-alert device 110 can include one or more modules, at least some of which are described herein. The modules can be implemented as computer-readable program code that, when executed by a processor 304, implement one or more of the various processes described herein in detail with reference to FIGS. 1-6. One or more of the modules can be a component of the processor(s) 304, or one or more of the modules can be executed on and/or distributed among other processing systems to which the processor(s) 304 is operatively connected. The modules can include instructions (e.g., program logic) executable by one or more processor(s) 304.

The processor 304 of the variable audible-alert device 110 can be a conventional central processing unit or any other type of device, or multiple devices, capable of manipulating or processing information. As may be appreciated, processor 304 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions.

The memory, or memory element, 306 may be a single memory device, a plurality of memory devices, and/or embedded circuitry of the processor 304. Such a memory device may be a read-only memory, random access memory, volatile memory, non-volatile memory, static memory, dynamic memory, flash memory, cache memory, and/or any device that stores digital information. Furthermore, arrangements described herein may take the form of a computer program product embodied in one or more computer-readable media having computer-readable program code embodied, e.g., stored, thereon.

Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. In the context of this document, a computer-readable storage medium may be any tangible medium that can contain, or store a program for use by or in connection with an instruction execution system, apparatus, or device.

The memory 306 is capable of storing machine readable instructions, or instructions, such that the machine readable instructions can be accessed by the processor 804. The machine readable instructions can comprise logic or algorithm(s) written in programming languages, and generations thereof, (e.g., 1GL, 2GL, 3GL, 4GL, or 5GL) such as, for example, machine language that may be directly executed by the processor 304, or assembly language, object-oriented programming (OOP), scripting languages, microcode, etc., that may be compiled or assembled into machine readable instructions and stored on the memory 306. Alternatively, the machine readable instructions may be written in a hardware description language (HDL), such as logic implemented via either a field-programmable gate array (FPGA) configuration or an application-specific integrated circuit (ASIC), or their equivalents. Accordingly, the methods and devices described herein may be implemented in any conventional computer programming language, as pre-programmed hardware elements, or as a combination of hardware and software components.

Note that when the processor 304 may include more than one processing device, the processing devices may be centrally located (e.g., directly coupled together via a wired and/or wireless bus structure) or may be distributed located (e.g., cloud computing via indirect coupling via a local area network and/or a wide area network). Further note that when the processor 304 implements one or more of its functions via a state machine, analog circuitry, digital circuitry, and/or logic circuitry, the memory and/or memory element 306 storing the corresponding operational instructions may be embedded within, or external to, the circuitry including the state machine, analog circuitry, digital circuitry, and/or logic circuitry.

Still further, the memory 306 stores, and the processor 304 executes, hard coded and/or operational instructions corresponding to at least some of the steps and/or functions illustrated in FIGS. 1-6. The variable audible-alert device 110 is operable to receive, via the communication interface 302 and communication path 213, sensor data 216 including at least one of vehicle operational data (such as speed) and/or vehicle user biometric data (such as object detection, pedestrian detection, gaze detection, face detection, etc.).

The communication interface 302 generally governs and manages data received via a vehicle network 212 and/or the wireless communications 122 and 124. There is no restriction on the present disclosure operating on any particular hardware arrangement and therefore the basic features herein may be substituted, removed, added to, or otherwise modified for improved hardware and/or firmware arrangements as they may develop.

The antenna 112, with the communication interface 302, operates to provide wireless communications with the variable audible-alert device 110, including wireless communication 226 and 242.

Such wireless communications may range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, 3GPP (3rd Generation Partnership Project), 4GPP (4th Generation Partnership Project), 5GPP (5th Generation Partnership Project), LTE (long term evolution), LTE Advanced, RFID, IEEE 802.11, Bluetooth, AMPS (advanced mobile phone services), digital AMPS, GSM (global system for mobile communications), CDMA (code division multiple access), LMDS (local multi-point distribution systems), MMDS (multi-channel-multi-point distribution systems), and/or variations thereof.

Other control units described with reference to FIG. 2, such as audio/visual control unit 208 and sensor control unit 214, may each also include a communication interface 302, a processor 304, and memory 306, that are communicatively coupled via a bus 308 as described in FIG. 3. As may be appreciated, the various control units may be implemented in combination with each other and/or selected multiple combinations.

In operation, the variable audible-alert device 110 may operate to provide an audible alert based on vehicle-environment recognition data. The vehicle-environment recognition data may be based on sensor devices operable to sense conditions external to a vehicle (such as the ambient vehicle environment, which may include pedestrians, objects, animals, driving conditions, traffic conditions, etc.), based on sensor devices operable to sense conditions internal to a vehicle (such as the vehicle cabin, as may relate to biometric sensor data relating to a vehicle driver's emotional state, eye-tracking, voice sensing, etc.), or a combination thereof. The variable audible-alert device 110 may select audible alert data from a plurality of audible alert data that corresponds to the vehicle-environment recognition data, that may be generated a s a command message and transmitted to effect an audible alert via an audible device, as is described in detail with reference to FIGS. 3-6.

Figure 4:
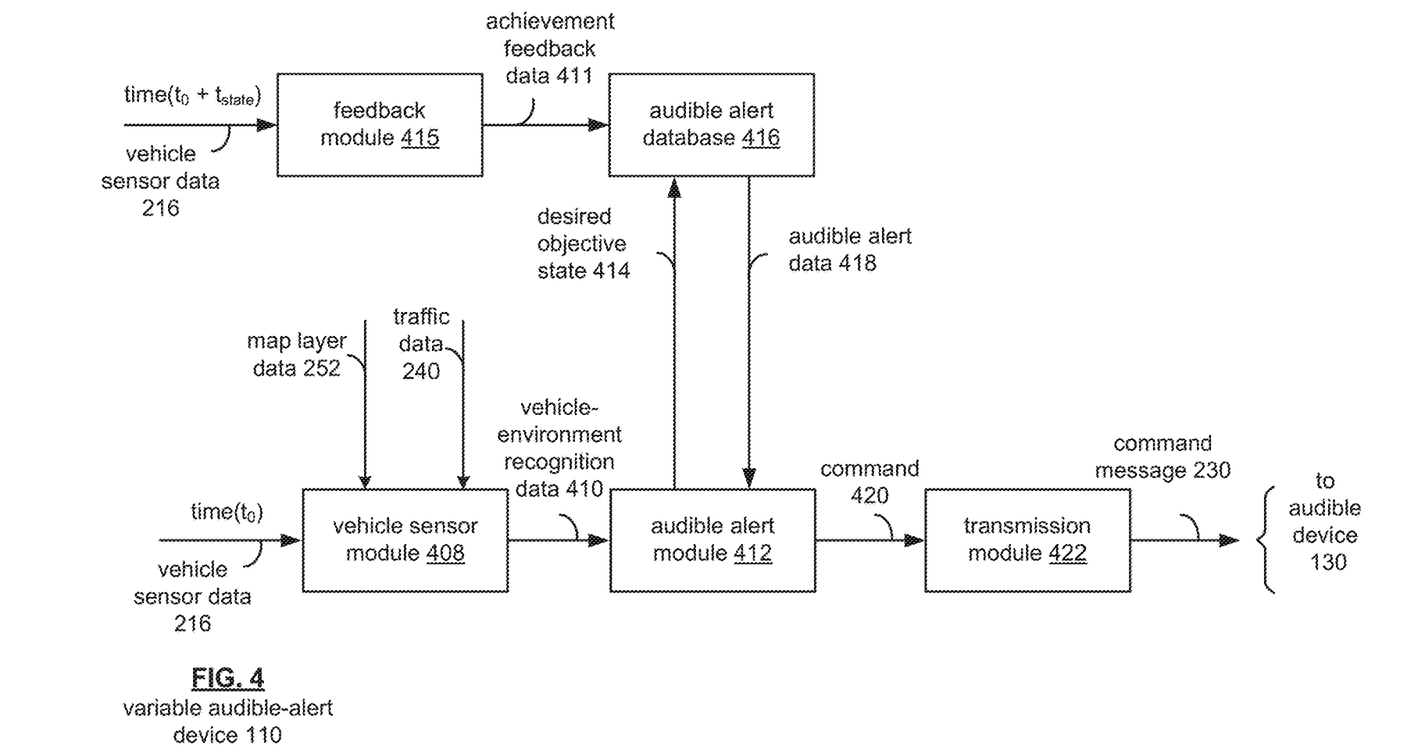
FIG. 4 illustrates a functional block diagram of a variable audible-alert device.

FIG. 4 illustrates a functional block diagram of a variable audible-alert device 110. The variable audible-alert device 110 may include a vehicle sensor module 408, an audible alert module 412, a feedback module 415, an audible alert database 416, and a transmission module 422.

In operation, the memory of the variable audible-alert device 110 may be communicably coupled to the processor 304 and to the plurality of vehicle sensor devices 102, 104a, 104b, 230, 232, 234, 236, 238 thru nnn (FIG. 3), and the memory 306 stores the vehicle sensor module 408 including instructions that when executed cause the processor 304 to receive vehicle sensor data 216 relating to a vehicle environment, which may also include map layer data 252, traffic data 240, and may further include other data relating to the vehicle environment, external and internal, to the vehicle 100.

The vehicle sensor module 408 may operate to process the vehicle sensor data 216 to produce vehicle-environment recognition data 410. The vehicle-environment recognition data 410 may be based on machine learning techniques (such as reinforcement learning (RL), convolutional neural networks (CNN), etc.), may be based on user history with respect to audible alerts issued within various vehicle environments, or may be based on combinations thereof.

In further operation, the memory 306 of the variable audible-alert device 110 may be communicably coupled to the processor 304 and to the plurality of vehicle sensor devices 102, 104a, 104b, 230, 232, 234, 236, 238 thru nnn (FIG. 3), and the memory 306 stores the audible alert module 412, including instructions that when executed cause the processor 304 to select audible alert data 418 from a plurality of audible alert data of the audible alert database 416. Selection of the audible alert data 418 may be based on a desired objective state 414. That is, based on the vehicle-environment recognition data 410, the desired objective state 414 relates to a corresponding audible alert to be emitted via the audible device 130 to achieve a desired objective state 414. The audible alert module 412 operates to generate a command 420 based on the audible alert data 418 for transmission via the transmission module 422 as a command message 230. The command message 230 may be formatted for transmission via the vehicle networks, such as in a data packet format. Upon transmission via the transmission module 422, the command message 230 may operate to effect an audible alert via the audible device 130. In this respect, when the vehicle operator presses the human-machine interface for the audible device 130, the audible alert may be issued via the audible device 130.

In this respect, the audible device 130 may be set-up, or configured, to provide an audible alert that may correspond with the vehicle-environment recognition data 410. A vehicle user may then press a human-machine interface associated with the audible device 130 to emit an audible alert tailored to the internal and/or external environment of the vehicle. The configuration of the audible device 130 may be on-going based on the vehicle sensor data 216, the traffic data 240, and/or the map layer data 252.

Furthermore, the variable audible-alert device 110 may return to a default audible alert, such as a conventional vehicle horn tone that may sound upon the vehicle operator pressing the human-machine interface. The return to a default alert may be based on a transition of the vehicle-environment recognition data 410 returning to a common vehicle operation scenario (such as returning to speed for highway driving, an acquaintance in a vehicle or on foot no longer being within vehicle sensor range or having moved on, etc.) following achievement of the desired object state 414.

Based on machine learning, such as reinforcement learning (RL), the feedback module 415 may operate to produce feedback data 411 based on vehicle sensor data 216 at a later time interval, such as a time $(t_0+t_{state})$. In the present example, the later time interval may correspond with the expected period for achieving the desired objective state 414. The feedback data 411 may operate to refine audible alert data 418 to better fit or match the audible alert data 418 of the audible alert database 416.

For example, a vehicle 100 may be stopped at a traffic light behind another vehicle. When the light turns green, but the leading vehicle does not move, the desired objective state 414 may be for the leading vehicle to being progressing through the intersection. The audible alert data 418 may include audible alert characteristics (such as volume, frequency, patterns, etc.) to prompt the leading vehicle to being traveling. A couple of short, low volume, audible alert 132 may typically be sufficient to alert the vehicle ahead that the light has changed to green, as opposed to a full volume, blaring audible alert 132 that may relate to greater traffic transgressions and/or dangers.

In this respect, the desired object state 414 may relate to prompting the vehicle ahead to begin moving forward through the green light within a certain amount of time. The feedback module 415 determines whether a satisfactory result was achieved by the audible alert data 418, and generates feedback data 411 for refining the audible alert data 418 as relating to internal and/or external environment conditions. For example, a favorable result may be when the leading vehicle begins to move forward within a certain amount of time. An unfavorable result at the other extreme may be when the leading vehicle does not react within a given amount of time, or may not move at all.

As another example, when the vehicle 100 may be aggressively cut off by another vehicle, a full blast honk or an angrier or harsh noise may be considered appropriate to relay the driver's frustration, which may be conveyed as the desired objective state 414 and a corresponding audible alert data 418. The audible alert data 418 corresponding to the desired object state 414 based on the vehicle-environment recognition data 410 may be a one long, loud, multi-frequency audible alert that the vehicle user may broadcast via the audible device 130 by pressing the human-machine interface. In this respect, the vehicle operator may simply press the human-machine interface for delivery of the appropriate audible alert, without the need to manually attempt delivering the appropriate audible alert.

In the alternative, the variable audible-alert device 110 may define the desired objective state 414 as to "bring no harm to the vehicle operator," and override the audible alert desired by the vehicle operator, to a less caustic audible alert that may not invite retribution by other vehicle operators and/or pedestrians.

In this respect, the desired object state 414 may relate to alerting the vehicle ahead to its erratic behavior, and perhaps to calm the vehicle operator (such as reducing blood pressure, calming the voice, etc.). The feedback module 415, based on vehicle sensor data 216 sampled at a time ($t_0+t_{state}$) to determine whether a satisfactory result of the desired objective state 414 was achieved by the audible alert data 418, and generates feedback data 411 for refining the audible alert data 418 as relating to internal and/or external environment conditions. For example, a favorable result may be when the leading vehicle ceases to driving erratically and the vehicle operator exhibits a calming effect by the result, as well as perhaps no property damage resulting to the vehicle 100 by the leading vehicle. An unfavorable result at the other extreme may be when the leading vehicle impacts the vehicle 100.

As yet another example, when the vehicle operator may be approaching a pedestrian or other driver that they know, a friendly audible alert 132 may be appropriate as a manner of drawing the individual's attention and providing a warm greeting, that the vehicle user may broadcast via the audible device 130 by pressing the human-machine interface. In this respect, the vehicle operator may simply press the human-machine interface for delivery of the appropriate friendly audible alert, without the need to manually attempt delivering the appropriate audible alert.

In this respect, the desired object state 414 may relate to gaining the attention of the pedestrian or other driver, which may be sensed by a friendly response by the pedestrian or other driver. The feedback module 415 determines whether a satisfactory result was achieved by the audible alert data 418, and generates feedback data 411 for refining the audible alert data 418 as relating to internal and/or external environment conditions. For example, a favorable result may be when the pedestrian or other driver leading vehicle responds with a friendly wave and smile. An unfavorable result at the other extreme may be that the pedestrian or other driver does not notice the audible alert that the vehicle operator issues based on the audible alert data 418.

Figure 5:
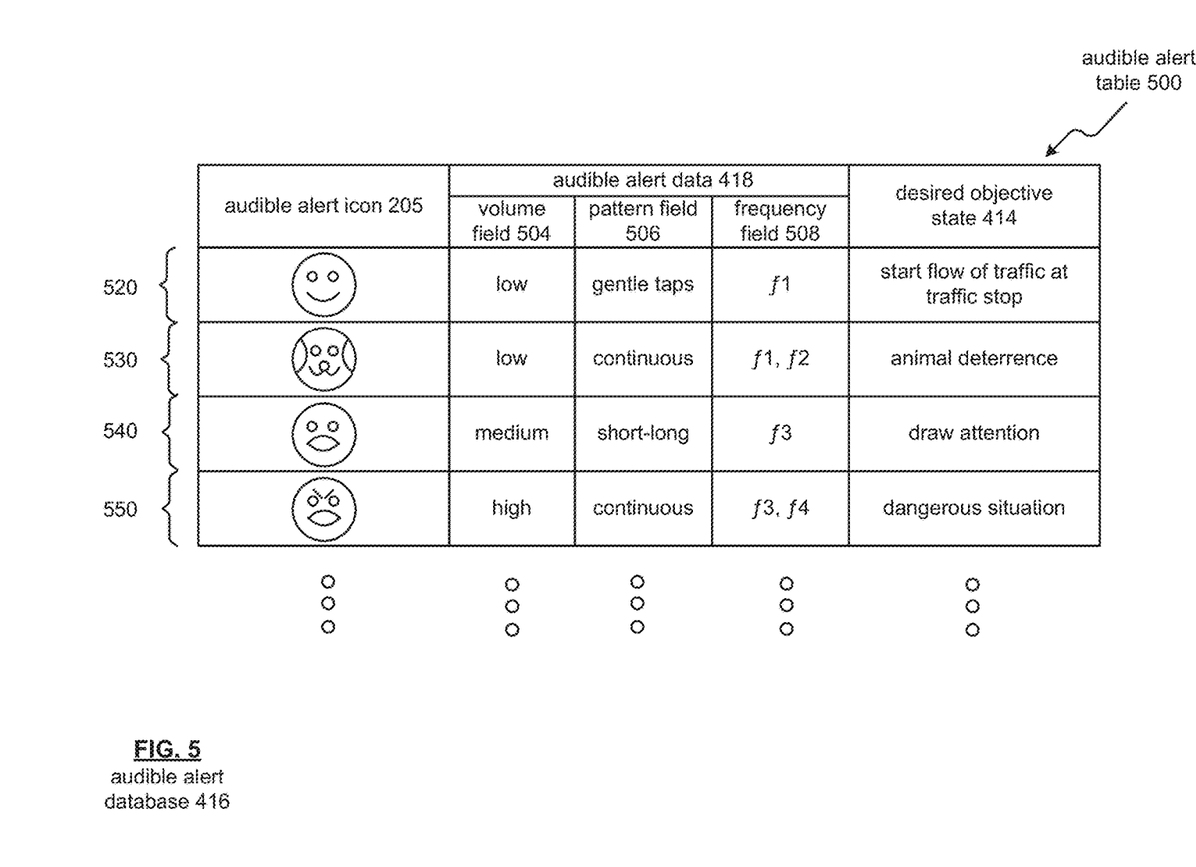
FIG. 5 illustrates an example audible alert database that includes an audible alert table.

FIG. 5 illustrates an example audible alert database 416 that includes an audible alert table 500. The audible alert table 500 may include table entries 520, 530, 540, 550, etc. Each table entry may include parameters such as an audible alert icon 205, audible alert data 418, and desired objective state 414. The audible alert data 418 may further include sub-parameters relating to tone characteristics for an audible device 130 (FIG. 4), such as volume field 504, pattern field 506, and frequency field 508.

The audible alert icon 205 may be in machine code format for display to the vehicle operator, such as via a touch screen 206 of the head unit device 202 (see FIG. 2), or other suitable display of the vehicle 100 (such as a heads-up display, a rearview mirror display, an instrument cluster display, etc.). The audible alert icons 205 may relate to a type of audible alert relating to a desired objective state 414, such as a smile icon, an animal icon, a surprised icon, an angry icon, etc. The volume field 504, pattern field 506, and frequency field 508 are the audible alert characteristics sounded while the vehicle operator presses the human-machine interface for the audible device 130.

The example for the table entry 520 relates to a smile icon for the audible alert icon 205. The audible alert data 418 may include a "low" value for the volume field 504, "gentle taps" for the pattern field 506, and a frequency f1, which may be a default frequency (or tone) defined for the audible device 130 (FIG. 1). The desired objective state 414 may relate to "start flow of traffic at a traffic stop," such as that may occur when the traffic light turns green. The audible alert data 418 for the table entry 520 may correlate with the desired objective state 414, and the sub-parameters 504, 506, and 508 may be adjusted based on the achievement feedback data 411 (FIG. 4).

The example for the table entry 530 relates to an animal icon for the audible alert icon 205. In this respect, the vehicle-environment recognition data 410 identifies an animal-type object in the external vehicle environment. The audible alert data 418 may include a "low" value for the volume field 504, a "continuous" pattern for the pattern field 506, and dual frequencies f1 and f2, which may include a default frequency (or tone) defined for the audible device 130 (FIG. 1), as well as a frequency f2 outside the range of the human ear, though detectable by animals.

When the vehicle operator may press the human-machine interface for an audible device 130, the default frequency f1 provides cause-and-effect feedback, while also providing a frequency directed towards animal hearing ranges. The desired objective state 414 may relate to "deterrence," such as that to cause an animal to stop or to flee from the vehicle 100. The audible alert data 418 for the table entry 530 may correlate with the desired objective state 414, and the sub-parameters 504, 506, and 508 may be adjusted and/or refined based on the achievement feedback data 411 (FIG. 4).

The example for the table entry 540 relates to a surprised icon for the audible alert icon 205. In this respect, the vehicle-environment recognition data 410 identifies a condition in the internal vehicle environment indicating that the biometric state of the vehicle operator is one of "surprise" or "being startled," and a further condition in the external vehicle environment that may prompt the vehicle operator's reaction (such as, for example, a ball crossing the street, another vehicle insufficiently yielding at a stop sign, etc.). The audible alert data 418 may include a "medium" value for the volume field 504, a "short-long" pattern for the pattern field 506, and frequency f3, which may be an integer and/or fractional multiple of the default frequency f1 (or tone) defined for the audible device 130 (FIG. 1).

When the vehicle operator may press the human-machine interface for an audible device 130, the frequency f3 may be a higher-pitched frequency that may convey the vehicle operator's feeling of agitation. The desired objective state 414 may relate to "draw attention," such as to draw a pedestrian (such as a child likely to chase the ball) or other driver (such as one not yielding at a stop) with respect to the vehicle 100. The audible alert data 418 for the table entry 540 may correlate with the desired objective state 414, and the sub-parameters 504, 506, and 508 may be adjusted and/or refined based on the achievement feedback data 411 (FIG. 4).

The example for the table entry 550 relates to an angry icon for the audible alert icon 205. In this respect, the vehicle-environment recognition data 410 identifies a condition in the internal vehicle environment indicating that the biometric state of the vehicle operator is one of "outrage," and a further condition in the external vehicle environment that may prompt the vehicle operator's reaction (such as, for example, being cut off by another vehicle, almost being collided with by another vehicle, erratic driving by a vehicle ahead, etc.). The audible alert data 418 may include a "high" value for the volume field 504, a "continuous" pattern for the pattern field 506, and frequencies f3 and f4.

When the vehicle operator may press the human-machine interface for an audible device 130, the frequencies f3 and f3 may, which may be an integer and/or fractional multiple of the default frequency f1 (or tone) that form a harmonic tone therebetween to further project a sense of anger via the audible device 130 (FIG. 1). The desired objective state 414 may relate to react to a "dangerous situation," such as a near collision, erratic driving by a vehicle ahead, being cut-off by another vehicle, etc. The audible alert data 418 for the table entry 540 may correlate with the desired objective state 414, and the sub-parameters 504, 506, and 508 may be adjusted and/or refined based on the achievement feedback data 411 (FIG. 4).

As indicated, additional table entries may be included with table entries 520, 530, 540, 550. A vehicle operator may add such table entries manually, from a list of options, etc. Also, the variable audible-alert device 110 of the disclosure may learn additional table entries, by learning to recognize the internal and/or external vehicle environment and associated vehicle operator interaction with the human-machine interface for the audible device 130. Such data may be considered as historic data of the vehicle operator, as well as sensing vehicle operator emotional states via biometric sensor devices, and related data.

Figure 6:
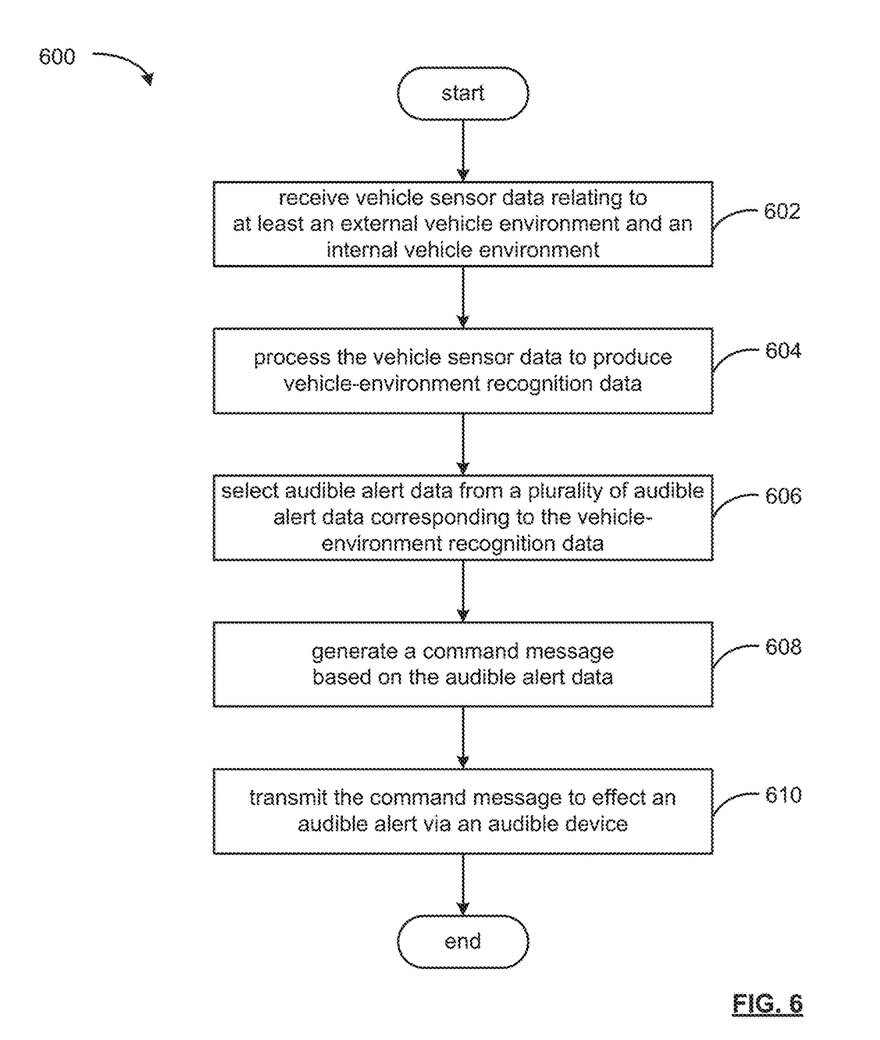
FIG. 6 illustrates an example process for a variable audible-alert device.

FIG. 6 illustrates a process 600 for a variable audible-alert device. At operation 602, the device may receive vehicle sensor data relating to at least one of an external vehicle environment and an internal vehicle environment. The vehicle sensor data may include at least one of eye-tracking sensor device data, object sensor device data, biometric sensor device data; and audible sensor device data. Further data may relate to positional and/or informational sources relating to the vehicle environment (such as map layer data from remote servers and/or databases, and/or traffic data such as that from vehicle-to-vehicle and vehicle-to-infrastructure communications).

The vehicle sensor data may be processed at operation 604 to produce vehicle-environment recognition data. The output may be The output may be based on machine learning techniques (such as reinforcement learning (RL), convolutional neural networks (CNN), etc.), and may also be trained and/or self-taught based on user history with respect to audible alerts issued within various vehicle environments, or may be based on combinations thereof.

In operation 606, audible alert data may be selected from a plurality of audible alert data corresponding to the vehicle-environment recognition data. In this respect, a desired objective state, or a series of intermediate states, may be defined. Audible alert data 418 may then be selected with respect to achieving the desired object state and/or intermediate states.

For example, when the vehicle-environment recognition data may indicate a green light though the leading vehicle is not moving, and blocks the flow of traffic behind. A desired objective state may be to initiate movement of the leading vehicle. In respect to achieving this state, the audible alert data may be selected with a view towards achieving this desired objective state. With respect to intermediate states, similar selection of audible alert data may take place to achieve intermediate states that may lead to a desired objective state.

Also, in an improvement and/or refinement of each of a plurality of audible alert data, achievement feedback data may be generated from subsequent vehicle sensor data (such as with reference to a time $t_0$, and a subsequent interval of time to plus $t_{state}$) relating to an effect of an announced audible alert based on the audible alert data. Based on the achievement feedback data with respect to the desired objective state, sub-parameters respective audible alert data may be refined, such as volume data, pattern field data, and frequency data.

At operation 608, a command message may be generated on the audible alert data. The command message is a format suitable for transmission within a vehicle networks. In this respect, the command message may be packetized to include header information relating to identifiers and/or addresses for other components and/or vehicle control units, as well as data payload information, that may deliver the audible alert data as payload data for the other components and/or vehicle control units, such as an audio/visual control unit 208 (FIG. 2) for visual feedback to a vehicle user, and for configuring the audible device 130 (FIG. 2) for an audible alert.

In operation 610, the command message may be transmitted to effect an audible alert via audible device (such as a vehicle horn, a vehicle speaker, etc.). The audible alert may be broadcast audible via the audible device upon engagement by the vehicle operator of a human-machine interface for the audible device based on the audible alert data.

The disclosure provided describes and method and device for variable audible-alerts, which may be based on vehicle-environment recognition data, directed to achieving a desired objective state. The vehicle-environment recognition data may include vehicle sensor devices operable to sense conditions external to a vehicle (such as the ambient vehicle environment, which may include pedestrians, objects, animals, driving conditions, traffic conditions, etc.), based on sensor devices operable to sense conditions internal to a vehicle (such as the vehicle cabin, as may relate to biometric sensor data relating to a vehicle driver's emotional state, eye-tracking, voice sensing, etc.), or a combination thereof. Additional information may be used with respect to vehicle-environment recognition data such as map layer data, traffic data (such as through vehicle-to-vehicle and/or vehicle-to-infrastructure communications).

Based on vehicle-environment recognition data, audible alert data from a plurality of audible alert data that may be generated as a command message and transmitted to effect an audible alert via an audible device, as is described in detail with reference to FIGS. 1-6.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-6, but the embodiments are not limited to the illustrated structure or application.

As one of ordinary skill in the art may appreciate, the term "substantially" or "approximately," as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items range from a difference of a few percent to magnitude differences.

As one of ordinary skill in the art may further appreciate, the term "coupled," as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (that is, where one element is coupled to another element by inference) includes direct and indirect coupling between two elements in the same manner as "coupled."

As one of ordinary skill in the art will further appreciate, the term "compares favorably," as may be used herein, indicates that a comparison between two or more elements, items, signals, et cetera, provides a desired relationship. For example, when the desired relationship is that a first signal has a greater magnitude than a second signal, a favorable comparison may be achieved when the magnitude of the first signal is greater than that of the second signal, or when the magnitude of the second signal is less than that of the first signal.

As the term "module" is used in the description of the drawings, a module includes a functional block that is implemented in hardware, software, and/or firmware that performs one or more functions such as the processing of an input signal to produce an output signal. As used herein, a module may contain submodules that themselves are modules.

The flowcharts and block diagrams in the figures illustrate the architecture, functionality, and operation of possible implementations of systems, methods and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage medium, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g. AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A method for a variable audible-alert device of a subject vehicle, the method comprising:

processing vehicle sensor data of the subject vehicle to produce vehicle-environment recognition data that characterizes at least present behaviors of the subject vehicle within a vehicle environment and an emotional state of a vehicle operator that is controlling the subject vehicle;

selecting an audible alert from audible alert data as a function of the vehicle-environment recognition data, wherein the audible alert data includes a plurality of distinct alerts with variations in at least volume, pattern, and frequency that correspond with different characteristics of the vehicle environment recognition data; and transmitting a command message to cause the variable audible-alert device of the subject vehicle to generate the audible alert externally from the subject vehicle to improve interactions of the subject vehicle with the vehicle environment.

2. The method of claim 1, further comprising:
generating a desired objective state based on the vehicle-environment recognition data;
generating achievement feedback data from subsequent vehicle sensor data relating to an effect of the audible alert on one more aspects of the vehicle environment; and
refining the audible alert based, at least in part, on the achievement feedback data with respect to the desired objective state.

3. The method of claim 2, wherein the desired objective state is based on historic data of the vehicle operator including past behaviors of the vehicle operator in relation to controlling the subject vehicle and in relation to an emotional state of the vehicle operator as embodied in the vehicle sensor data.

4. The method of claim 2, wherein the desired objective state includes biometric sensor device data relating to the vehicle operator and at least a current emotional state of the vehicle operator.

5. The method of claim 1, wherein the audible alert data includes distinct tones for particular configurations of the vehicle environment and the emotional state, and wherein the variable audible-alert device returns to a default alert after producing the audible alert selected according to the vehicle-environment recognition data.

6. The method of claim 1, wherein transmitting the command message further comprises:
transmitting, responsive to an electronic signal from a human-machine interface, the command message indicating a request to generate the audible alert external to the subject vehicle.

7. The method of claim 1, wherein the vehicle is a hybrid electric vehicle, and wherein the vehicle sensor data comprises at least one of:
eye-tracking sensor device data;
object sensor device data;
biometric sensor device data; and
audible sensor device data.

8. A method for a variable audible-alert device of a subject vehicle, the method comprising:
processing vehicle sensor data of the subject vehicle to produce vehicle-environment recognition data that characterizes at least present behaviors of the subject vehicle within a vehicle environment and an emotional state of a vehicle operator that is controlling the subject vehicle;
selecting an audible alert from audible alert data as a function of the vehicle-environment recognition data, wherein the audible alert data includes a plurality of distinct alerts with variations in at least volume, pattern, and frequency that correspond with different characteristics of the vehicle environment recognition data; and
transmitting a command to cause the variable audible-alert device of the subject vehicle to generate the audible alert externally from the subject vehicle.

9. The method of claim 8, further comprising:
generating a desired objective state based on the vehicle-environment recognition data;
capturing feedback data from subsequent vehicle sensor data relating to an effect of the audible alert; and
refining the selecting of the audible alert data from the plurality of audible alert data based on the feedback data with respect to the desired objective state.

10. The method of claim 9, wherein the desired objective state is based on historic data of a vehicle operator including past behaviors of the vehicle operator in relation to controlling the subject vehicle and in relation to the emotional state of the vehicle operator as embodied in the vehicle sensor data.

11. The method of claim 9, wherein the desired objective state includes biometric sensor device data relating to the vehicle operator and at least the emotional state of the vehicle operator.

12. The method of claim 8, wherein the audible alert data includes distinct tones for particular configurations of the vehicle environment and the emotional state.

13. The method of claim 8, wherein the transmitting the command to effect an audible alert further comprising:
transmitting, responsive to an electronic signal from a human-machine interface, the command indicating a request to generate the audible alert external to the subject vehicle.

14. The method of claim 8, wherein the vehicle sensor data comprises at least one of:
eye-tracking sensor device data;
object sensor device data;
biometric sensor device data; and
audible sensor device data.

15. A variable audible-alert device of a subject vehicle comprising:
a communication interface to service communication with a vehicle network;
a processor coupled to the communication interface and in communication with a plurality of vehicle sensor devices, the processor for controlling operations of the variable audible-alert device; and
memory coupled to the processor and to the plurality of vehicle sensor devices, and the memory storing:
a vehicle sensor module including instructions that when executed cause the processor to:
process vehicle sensor data from the vehicle sensor devices to produce vehicle-environment recognition data that characterizes at least present behaviors of the subject vehicle within a vehicle environment and an emotional state of a vehicle operator that is controlling the subject vehicle; and
an audible alert module including instructions that when executed cause the processor to:
select an audible alert from audible alert data as a function of the vehicle-environment recognition data, wherein the audible alert date includes a plurality of distinct alerts with variations in at least volume, pattern, and frequency that correspond with different characteristics of the vehicle-environment recognition data; and generate a command to effect the audible alert via the variable audible-alert device of the subject vehicle, wherein the command causes the audible device to provide the audible alert externally to the subject vehicle to improve interactions of the subject vehicle with the vehicle environment.

16. The variable audible-alert device of claim 15, wherein the audible alert module including further instructions that when executed cause the processor to:
generate a desired objective state based on the vehicle-environment recognition data;
receive subsequent vehicle-environment recognition data based on relating to an effect of the audible alert on one more aspects of the vehicle environment; and
refine the audible alert based, at least in part, on the subsequent vehicle-environment recognition data with respect to achievement feedback data of the desired objective state.

17. The variable audible-alert device of claim 16, wherein the desired objective state is based on historic data of the vehicle operator including past behaviors of the vehicle operator in relation to controlling the subject vehicle and in relation to an emotional state of the vehicle operator as embodied in the vehicle sensor data.

18. The variable audible-alert device of claim 16, wherein the desired objective state includes biometric sensor device data relating to the vehicle operator and at least a current emotional state of the vehicle operator.

19. The variable audible-alert device of claim 15, wherein the audible alert data includes distinct tones for particular configurations of the vehicle environment and the emotional state.

20. The variable audible-alert device of claim 15, wherein the vehicle sensor data comprises at least one of:
eye-tracking sensor device data;
object sensor device data;
biometric sensor device data; and
audible sensor device data.

* * * * *

UNITED STATES PATENT AND TRADEMARK OFFICE
CERTIFICATE OF CORRECTION

PATENT NO. : 10,205,428 B1
APPLICATION NO. : 15/799285
DATED : February 12, 2019
INVENTOR(S) : Stephanie Paepcke et al.

Page 1 of 1

It is certified that error appears in the above-identified patent and that said Letters Patent is hereby corrected as shown below:

In the Specification

Column 1, Line 31:
Delete "convention" and add "conventional"

Column 3, Line 1:
Delete "configuration" and add "configurations"

Column 3, Line 20:
Amend "audible alert 132" as shown "audible alerts 132"

Column 5, Line 15:
Add "be" between "may" and "configured"

Column 7, Line 41:
Delete "operates" and add "operate"

In the Claims

Column 21, Lines 5-6:
Amend "the audible device" as shown "the variable audible-alert device"

Signed and Sealed this
Eighteenth Day of June, 2019

Andrei Iancu
*Director of the United States Patent and Trademark Office*